United States Patent
Yamagami et al.

(10) Patent No.: US 11,024,439 B2
(45) Date of Patent: *Jun. 1, 2021

(54) PARTICLES, CONNECTING MATERIAL AND CONNECTION STRUCTURE

(71) Applicant: SEKISUI CHEMICAL CO., LTD., Osaka (JP)

(72) Inventors: Mai Yamagami, Osaka (JP); Satoshi Haneda, Osaka (JP); Takeshi Wakiya, Osaka (JP); Yasuyuki Yamada, Shiga (JP); Saori Ueda, Shiga (JP); Masao Sasadaira, Shiga (JP)

(73) Assignee: SEKISUI CHEMICAL CO., LTD., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/767,833

(22) PCT Filed: Nov. 18, 2016

(86) PCT No.: PCT/JP2016/084307
§ 371 (c)(1),
(2) Date: Apr. 12, 2018

(87) PCT Pub. No.: WO2017/086452
PCT Pub. Date: May 26, 2017

(65) Prior Publication Data
US 2018/0301237 A1    Oct. 18, 2018

(30) Foreign Application Priority Data

Nov. 20, 2015  (JP) .............................. JP2015-227436
Nov. 20, 2015  (JP) .............................. JP2015-227437
(Continued)

(51) Int. Cl.
*B23K 35/36*     (2006.01)
*B23K 35/02*     (2006.01)
(Continued)

(52) U.S. Cl.
CPC ............... *H01B 1/22* (2013.01); *B22F 1/025* (2013.01); *B22F 7/064* (2013.01); *B22F 7/08* (2013.01);
(Continued)

(58) Field of Classification Search
CPC .... H01B 1/22; H01B 1/00; H01B 5/00; B22F 7/08; B23K 35/025; B23K 35/24;
(Continued)

(56) References Cited

U.S. PATENT DOCUMENTS

2006/0154070 A1 * 7/2006 Wakiya ................. B22F 1/0062
428/403
2007/0145585 A1   6/2007 Jun et al.
(Continued)

FOREIGN PATENT DOCUMENTS

CN        1554100      12/2004
CN       101529603      9/2009
(Continued)

OTHER PUBLICATIONS

Machine translation WO 2015/141830 (Year: 2015).*
(Continued)

*Primary Examiner* — Alexandre F Ferre
(74) *Attorney, Agent, or Firm* — Wenderoth, Lind & Ponack, L.L.P.

(57) ABSTRACT

Particles that can suppress the occurrence of cracking or peeling during a thermal cycle in a connection part that connects two members to be connected, further can suppress the variation in thickness in the connection part, and can increase the connection strength are provided. The particles according to the present invention are particles used to obtain a connecting material for forming a connection part that connects two members to be connected, and the particles are used for forming the connection part such that
(Continued)

thickness of the connection part after connection is twice or less the average particle diameter of the particles before connection, or the particles have an average particle diameter of 1 μm or more and 300 μm or less, the particles have a 10% K value of 30 N/mm² or more and 3000 N/mm² or less, and the particles have a particle diameter CV value of 10% or less.

7 Claims, 2 Drawing Sheets

(30) Foreign Application Priority Data

Jul. 28, 2016 (JP) .............. JP2016-148551
Jul. 28, 2016 (JP) .............. JP2016-148552

(51) Int. Cl.
| | |
|---|---|
| B23K 35/30 | (2006.01) |
| C08F 216/06 | (2006.01) |
| C08F 212/36 | (2006.01) |
| C08F 36/20 | (2006.01) |
| C09J 9/02 | (2006.01) |
| H01B 1/22 | (2006.01) |
| B22F 7/08 | (2006.01) |
| C08F 30/08 | (2006.01) |
| C08F 36/08 | (2006.01) |
| H01R 11/01 | (2006.01) |
| C08F 16/32 | (2006.01) |
| H01B 5/00 | (2006.01) |
| C09J 201/00 | (2006.01) |
| B23K 35/26 | (2006.01) |
| B22F 7/06 | (2006.01) |
| B22F 1/02 | (2006.01) |
| B23K 35/24 | (2006.01) |
| C08F 12/36 | (2006.01) |
| C09J 11/08 | (2006.01) |
| C08F 16/20 | (2006.01) |
| C08G 61/02 | (2006.01) |
| H01L 23/00 | (2006.01) |
| B22F 1/00 | (2006.01) |

(52) U.S. Cl.
CPC ............ *B23K 35/025* (2013.01); *B23K 35/24* (2013.01); *B23K 35/262* (2013.01); *B23K 35/302* (2013.01); *B23K 35/3006* (2013.01); *B23K 35/3013* (2013.01); *B23K 35/3033* (2013.01); *B23K 35/3613* (2013.01); *C08F 12/36* (2013.01); *C08F 16/20* (2013.01); *C08F 16/32* (2013.01); *C08F 30/08* (2013.01); *C08F 36/08* (2013.01); *C08G 61/02* (2013.01); *C09J 9/02* (2013.01); *C09J 11/08* (2013.01); *C09J 201/00* (2013.01); *H01B 5/00* (2013.01); *H01L 24/29* (2013.01); *H01R 11/01* (2013.01); *B22F 1/0011* (2013.01); *B22F 1/0059* (2013.01); *B22F 2301/10* (2013.01); *B22F 2301/15* (2013.01); *B22F 2301/255* (2013.01); *B22F 2301/30* (2013.01); *B22F 2304/10* (2013.01); *B23K 35/0244* (2013.01); *C08G 2261/3142* (2013.01); *C08G 2261/3321* (2013.01); *H01L 2224/29391* (2013.01); *H01L 2224/29411* (2013.01); *H01L 2224/29439* (2013.01); *H01L 2224/29444* (2013.01); *H01L 2224/29447* (2013.01); *H01L 2224/29455* (2013.01); *H01L 2224/29499* (2013.01); *H01L 2924/0635* (2013.01); *H01L 2924/35121* (2013.01)

(58) Field of Classification Search
CPC ...... B23K 35/3613; C08F 12/36; C08F 16/20; C08F 16/32; C08F 30/08; C08F 36/08
USPC ......................................................... 428/403
See application file for complete search history.

(56) References Cited

U.S. PATENT DOCUMENTS

| | | |
|---|---|---|
| 2007/0025112 A1 | 11/2007 | Jun et al. |
| 2008/0156398 A1 | 7/2008 | Yasuda et al. |
| 2010/0147355 A1 | 6/2010 | Shimizu et al. |
| 2010/0328895 A1 | 12/2010 | Bhagwagar et al. |
| 2011/0127068 A1* | 6/2011 | Wada ............... C08F 220/18 174/126.1 |
| 2012/0118480 A1* | 5/2012 | Paik .................. C09J 5/06 156/73.1 |
| 2016/0035925 A1 | 2/2016 | Shimizu et al. |
| 2017/0025374 A1 | 1/2017 | Fujiwara et al. |
| 2017/0110806 A1 | 4/2017 | Igarashi et al. |

FOREIGN PATENT DOCUMENTS

| | | | |
|---|---|---|---|
| CN | 103946929 | | 7/2014 |
| CN | 104704579 | | 6/2015 |
| EP | 3 375 808 | | 9/2018 |
| JP | 11-035914 | | 2/1999 |
| JP | 11126516 A | * | 5/1999 |
| JP | 2008-178911 | | 8/2008 |
| JP | 2011-094146 | | 5/2011 |
| JP | 2012-064559 | * | 3/2012 |
| JP | 2012-64559 | | 3/2012 |
| JP | 2012-209097 | * | 10/2012 |
| JP | 2012-216530 | | 11/2012 |
| JP | 2012-248531 | * | 12/2012 |
| JP | 2013-054851 | | 3/2013 |
| JP | 2013-119594 | | 6/2013 |
| JP | 2014-29855 | | 2/2014 |
| JP | 2014-081928 | * | 5/2014 |
| JP | 2014-81928 | | 5/2014 |
| JP | 2014-089849 | | 5/2014 |
| JP | 2014-116112 | | 6/2014 |
| JP | 2014-123456 | | 7/2014 |
| JP | 2014-127464 | | 7/2014 |
| JP | 2014-239052 | | 12/2014 |
| JP | 2015-176823 | * | 10/2015 |
| JP | 2015-176824 | * | 10/2015 |
| JP | 2015-195198 | | 11/2015 |
| JP | 2016-15256 | | 1/2016 |
| KR | 10-667376 | | 1/2007 |
| TW | 200948851 | | 12/2009 |
| WO | 2009/119788 | | 10/2009 |
| WO | WO2009/119788 | * | 10/2009 |
| WO | 2010/013668 | | 2/2010 |
| WO | 2010/032854 | | 3/2010 |
| WO | 2012/020799 | | 2/2012 |
| WO | 2013/042785 | | 3/2013 |
| WO | 2013/085039 | | 6/2013 |
| WO | WO-2015141830 A1 * | 9/2015 | .............. H01R 4/04 |
| WO | 2015/151136 | | 10/2015 |

OTHER PUBLICATIONS

Machine translation JP H11126516 (Year: 1999).*
International Search Report dated Dec. 27, 2016 in International Application No. PCT/JP2016/084307.
International Search Report dated Dec. 27, 2016 in International Application No. PCT/JP2016/084308.
International Search Report dated Dec. 27, 2016 in International Application No. PCT/JP2016/084309.
International Search Report dated Dec. 27, 2016 in International Application No. PCT/JP2016/084310.

(56) References Cited

OTHER PUBLICATIONS

International Preliminary Report on Patentability dated May 22, 2018 in International (PCT) Application No. PCT/JP2016/084307.
International Preliminary Report on Patentability dated May 22, 2018 in International (PCT) Application No. PCT/JP2016/084308.
International Preliminary Report on Patentability dated May 22, 2018 in International (PCT) Application No. PCT/JP2016/084309.
International Preliminary Report on Patentability dated May 22, 2018 in International (PCT) Application No. PCT/JP2016/084310.
Extended European Search Report dated Jun. 4, 2019 in corresponding European Patent Application No. 16866452.2.
Extended European Search Report dated Jun. 4, 2019 in European Patent Application No. 16866453.0.
Extended European Search Report dated Jun. 4, 2019 in European Patent Application No. 16866454.8.
Extended European Search Report dated Jun. 4, 2019 in European Patent Application No. 16866455.5.

* cited by examiner

[FIG. 1]
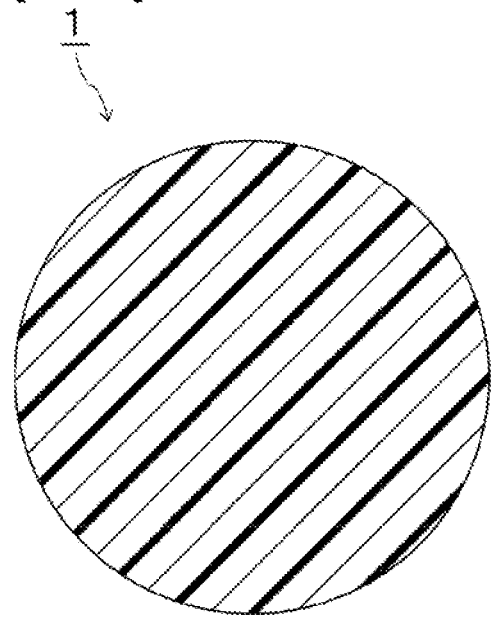
[FIG. 2]
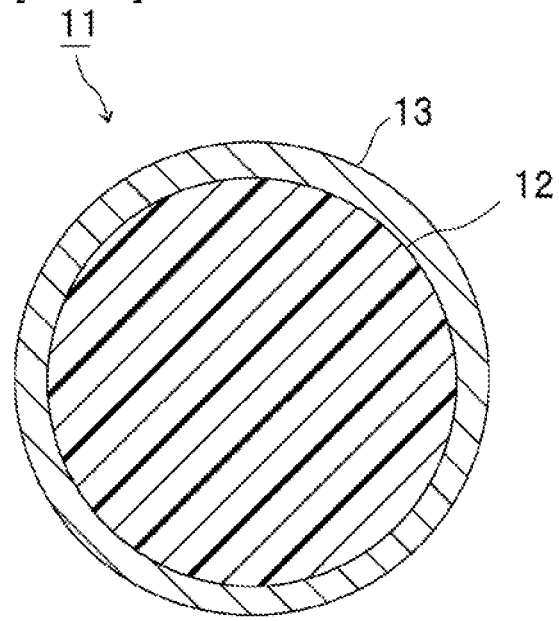

[FIG. 3]
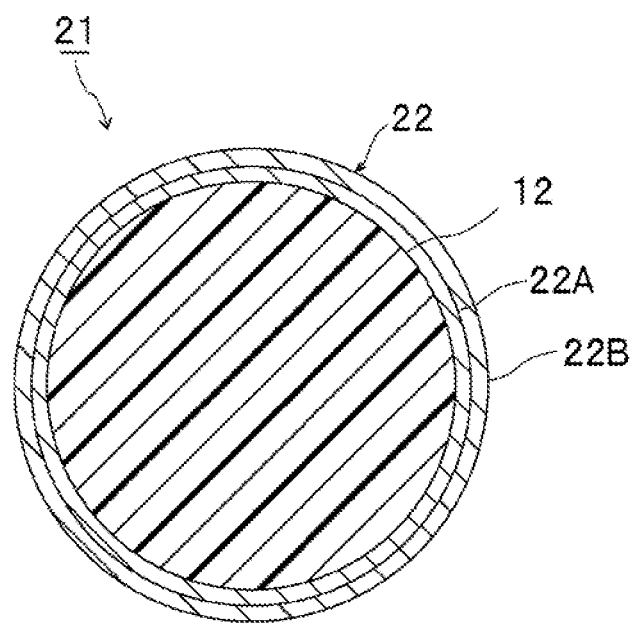
[FIG. 4]
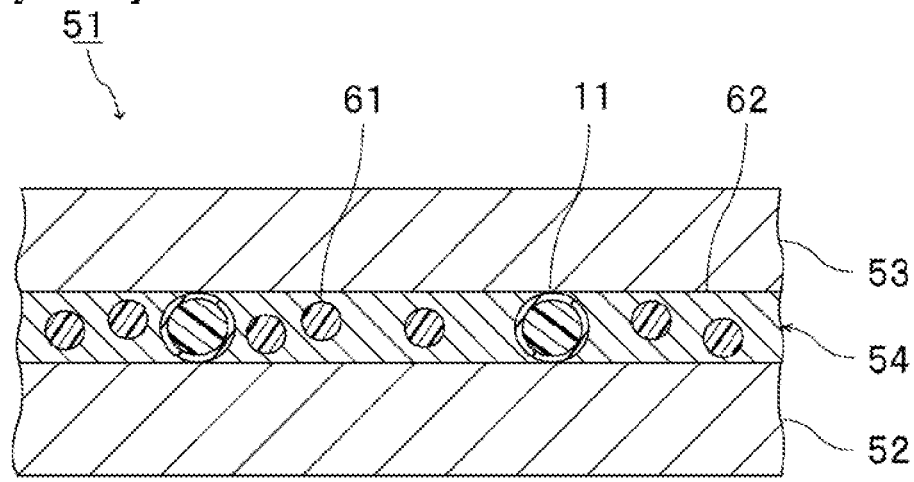

PARTICLES, CONNECTING MATERIAL AND CONNECTION STRUCTURE

TECHNICAL FIELD

The present invention relates to particles used to obtain a connecting material for forming a connection part that connects two members to be connected. Further, the present invention relates to a connecting material and a connection structure, provided with the above particles.

BACKGROUND ART

In a non-insulation type semiconductor device that is one of the power semiconductor devices used for an inverter or the like, a member for fixing a semiconductor element is also one of the electrodes of the semiconductor device. For example, in a semiconductor device in which a power transistor is mounted on a fixing member using a Sn-Pb-based soldering material, the fixing member (base material) connecting two members to be connected serves as a collector electrode of the power transistor.

In addition, it is known that when the particle diameter of a metal particle becomes small to a size of 100 nm or less and the number of constituent atoms is reduced, the surface area ratio to the volume of the particle rapidly increases, and the melting point or the sintering temperature decreases largely as compared with that in the bulk state. A method in which by utilizing the low temperature firing function, and by using the metal particles having an average particle diameter of 100 nm or less, the surfaces of which are coated with an organic substance, as a connecting material, the connection is performed by decomposing the organic substance by heating, and by sintering the metal particles to one another is known. In this connection method, metal particles after connection change to a bulk metal, and at the same time, connection by metal bonding is obtained in the connection interface, therefore, the heat resistance, the connection reliability, and the heat dissipation become extremely high. A connection material for performing such a connection has been disclosed, for example, in the following Patent Document 1.

In Patent Document 1, a connecting material containing one or more kinds of the metal particle precursors selected from particles of a metal oxide, a metal carbonate, or a metal carboxylate, and a reducing agent that is an organic substance has been disclosed. The average particle diameter of the metal particle precursors is 1 nm or more and 50 µm or less. In the total parts by mass in the above connection material, the content of the metal particle precursors exceeds 50 parts by mass and 99 parts by mass or less.

In the following Patent Document 2, a composite material containing a thermally conductive metal having a melting point (a), and silicone particles (b) has been disclosed. The silicone particles (b) are dispersed in the thermally conductive metal (a).

RELATED ART DOCUMENT

Patent Document

Patent Document 1: JP 2008-178911 A
Patent Document 2: JP 2013-243404 A

SUMMARY OF THE INVENTION

Problems to be Solved by the Invention

In the above collector electrode, a current of several amperes or more flows during operation of the semiconductor device, and the transistor chip generates heat. As described above, the connection part that connects two members to be connected is exposed to thermal cycling conditions. A member to be connected such as a semiconductor wafer and a semiconductor chip is easily warped by a thermal cycle, as a result, cracks tend to occur in the member to be connected or the connection part, and peeling of the member to be connected is easy to occur. With the conventional connecting material, it is difficult to sufficiently suppress the occurrence of cracking and peeling.

In addition, it is preferred that the distance between the two members to be connected that are connected by the connection part is uniform. Therefore, it is preferred that the variation in the thickness of the connection part is small. With the conventional connecting material, it is difficult to control the distance between the two members to be connected with high accuracy. In Patent Document 2, silicone particles are not used as gap control particles.

An object of the present invention is to provide particles capable of suppressing the occurrence of cracking or peeling during a thermal cycle in a connection part that connects two members to be connected, and further capable of suppressing the variation in thickness in the connection part and increasing the connection strength. Further, an object of the present invention is also to provide a connecting material and a connection structure, provided with the above particles.

Means for Solving the Problems

According to a broad aspect of the present invention, particles that are used to obtain a connecting material for forming a connection part that connects two members to be connected, in which the particles are used for forming the connection part such that thickness of the connection part after connection is twice or less the average particle diameter of the particles before connection, or the particles have an average particle diameter of 1 µm or more and 300 µm or less, the particles have a 10% K value of 30 N/mm$^2$ or more and 3000 N/mm$^2$ or less, and the particles have a particle diameter CV value of 10% or less, are provided.

In a certain specific aspect of the particles according to the present invention, the particles are used for forming a connection part such that, thickness of the connection part after connection is twice or less the average particle diameter of the particles before connection.

In a certain specific aspect of the particles according to the present invention, the particles have an average particle diameter of 1 µm or more and 300 µm or less.

In a certain specific aspect of the particles according to the present invention, the number of aggregated particles per million particles of the above particles is 100 or less.

In a certain specific aspect of the particles according to the present invention, the particles have a thermal decomposition temperature of 200° C. or more.

In a certain specific aspect of the particles according to the present invention, a material for the particles contains a vinyl compound, a (meth)acrylic compound, an α-olefin compound, a diene compound, or a silicone compound.

In a certain specific aspect of the particles according to the present invention, the particles each have no conductive part on an outer surface part thereof.

In a certain specific aspect of the particles according to the present invention, the particles each have a base material particle, and a conductive part disposed on a surface of the base material particle.

In a certain specific aspect of the particles according to the present invention, a material for the conductive part contains nickel, gold, silver, copper, or tin.

In a certain specific aspect of the particles according to the present invention, the particles are used for forming the connection part such that one particle is in contact with both of the two members to be connected.

According to a broad aspect of the present invention, a connecting material being used for forming a connection part that connects two members to be connected, and containing the above-described particles, and a resin or metal atom-containing particles is provided.

In a certain specific aspect of the connecting material according to the present invention, the connecting material contains the metal atom-containing particles, and a thermal decomposition temperature of the particles is higher than a melting point of the metal atom-containing particles.

In a certain specific aspect of the connecting material according to the present invention, the connecting material contains the metal atom-containing particles, and the connecting material is used for forming the connection part by melting the metal atom-containing particles followed by solidifying the metal atom-containing particles.

According to a broad aspect of the present invention, a connection structure in which a first member to be connected, a second member to be connected, and a connection part that connects the first member to be connected and the second member to be connected are included, and a material for the connection part is the above-described connecting material is provided.

Effect of the Invention

The particles according to the present invention are particles used to obtain a connecting material for forming a connection part that connects two members to be connected. In the particles according to the present invention, the particles are used for forming the connection part such that thickness of the connection part after connection is twice or less the average particle diameter of the particles before connection, or the particles have an average particle diameter of 1 μm or more and 300 μm or less, the particles have a 10% K value of 30 N/mm² or more and 3000 N/mm² or less, and the particles have a particle diameter CV value of 10% or less, therefore, when a connection part that connects two members to be connected is formed by a connecting material containing the above particles, the occurrence of cracking or peeling during a thermal cycle can be suppressed, further the variation in thickness in the connection part can be suppressed, and the connection strength can be increased.

BRIEF DESCRIPTION OF DRAWINGS

FIG. 1 is a sectional view showing the particle according to the first embodiment of the present invention.

FIG. 2 is a sectional view showing the particle according to the second embodiment of the present invention.

FIG. 3 is a sectional view showing the particle according to the third embodiment of the present invention.

FIG. 4 is a front sectional view schematically showing a connection structure using the particle according to the second embodiment of the present invention.

MODES FOR CARRYING OUT THE INVENTION

Hereinafter, details of the present invention will be described.

(Particles)

The particles according to the present invention are particles used to obtain a connecting material for forming a connection part that connects two members to be connected.

The particles according to the present invention are (1) used for forming the connection part such that thickness of the connection part after connection is twice or less the average particle diameter of the particles before connection, or (2) the particles having an average particle diameter of 1 μm or more and 300 μm or less. The present invention may have the constitution of the above (1), may have the constitution of the above (2), or may have both of the constitutions of the above (1) and (2).

The particles according to the present invention have a 10% K value of 30 N/mm² or more and 3000 N/mm² or less. The particles according to the present invention have a particle diameter CV value of 10% or less.

In the present invention, the above constitution is provided, therefore, in a connection part that connects two members to be connected, the occurrence of cracking or peeling of the members to toe connected during a thermal cycle can be suppressed, further the variation in thickness in the connection part can foe suppressed, and the connection strength can be increased.

In the present invention, in the connection part, the particles can act as a gap control material (gap control particles), and in particular, can act as a gap control material (gap control particles) during a thermal cycle.

It is preferred that the particles according to the present invention are (1) used for forming the connection part such that thickness of the connection part after connection is twice or less the average particle diameter of the particles before connection.

The 10% K value is a compression modulus when a particle is compressed by 10%. From the viewpoint of exhibiting the gap control characteristics and of suppressing the occurrence of cracking or peeling during a thermal cycle, the 10% K value of the particles is 30 N/mm² or more and 3000 N/mm² or less. From the viewpoint of exhibiting the gap control characteristics and of further suppressing the occurrence of cracking or peeling during a thermal cycle, the 10% K value is preferably 80 N/mm² or more, and more preferably 300 N/mm² or more. From the viewpoint of exhibiting the gap control characteristics and of further suppressing the occurrence of cracking or peeling during a thermal cycle, the 10% K value of the particles is preferably 2500 N/mm² or less, more preferably 1500 N/mm² or less, and furthermore preferably less than 980 N/mm².

The 10% K value of the particles can be measured as follows.

Using a micro compression testing machine, a particle is compressed at a smooth indenter end face of a cylinder (diameter of 50 μm, made of diamond) under the condition of loading a maximum test load of 20 mN over 60 seconds at 25° C. The load value (N) and compression displacement (mm) at this time are measured. From the obtained measurement values, the 10% K value (compression modulus) can be determined by the following equation. As the micro compression testing machine, for example, "Fischer Scope H-100" manufactured by FISCHER INSTRUMENTS K.K., or the like is used.

10% K value (N/mm²)=$(3/2^{1/2}) \cdot F \cdot S^{-3/2} \cdot R^{-1/2}$

F: Load value (N) when the particle is compressed and deformed by 10%

S: Compression displacement (mm) when the particle is compressed and deformed by 10%

R: Radius of the particle (mm)

The coefficient of variation (CV value) of the particle diameter of the particles is 10% or less. From the viewpoint of further suppressing the occurrence of cracking or peeling during a thermal cycle, the particle diameter CV value of the particles is preferably 7% or less, and more preferably 5% or less. The lower limit of the particle diameter CV value of the particles is not particularly limited. The CV value may also be 0% or more.

The coefficient of variation (CV value) is represented by the following equation.

$$CV\ value(\%) = (\rho/Dn) \times 100$$

$\rho$: Standard deviation of the particle diameter of the particle

Dn: Average value of the particle diameter of the particle

It is preferred that the average particle diameter of the particles is 1 μm or more and 300 μm or less. However, when the constitution of the above (1) is provided, the average particle diameter of the particles may also be less than 1 μm, or may exceed 300 μm. The average particle diameter of the particles may also exceed 15 μm, may also exceed 20 μm, or may also exceed 50 μm.

From the viewpoint of exhibiting the gap control characteristics and of further suppressing the occurrence of cracking or peeling during a thermal cycle, the average particle diameter of the particles is preferably 1 μm or more, and is preferably 300 μm or less. From the viewpoint of exhibiting the gap control characteristics and of further suppressing the occurrence of cracking or peeling during a thermal cycle, the average particle diameter of the particles is preferably 5 μm or more, more preferably 10 μm or more, and furthermore preferably 20 μm or more. From the viewpoint of exhibiting the gap control characteristics and of further suppressing the occurrence of cracking or peeling during a thermal cycle, the average particle diameter of the particles is preferably 200 μm or less, more preferably 150 μm or less, and furthermore preferably 100 μm or less.

The average particle diameter of the particles can be determined by observing the particles with a scanning electron microscope, and by arithmetically averaging the maximum diameters of 50 particles arbitrarily selected in the observed image.

In the present invention, it is preferred that the particles be used for forming the connection part such that one particle is in contact with both of the two members to be connected. In this case, one particle is in contact with one member to be connected on one side of the particle, and is in contact with another member to be connected on the other side of the particle.

Hereinafter, the present invention will be specifically described while making reference to drawings. In the following embodiments of particles, some portions different from each other can be replaced.

FIG. 1 is a sectional view showing the particle according to the first embodiment of the present invention.

A particle 1 shown in FIG. 1 is a particle having no conductive part. The particle 1 is, for example, a particle excluding metal particles. The particle 1 is, for example, a resin particle.

As the particle 1, the particles according to the present invention each may not have a conductive part. When the particle has no conductive part, the particle can be used without forming any conductive part on a surface of the particle. As a particle described later, the particles according to the present invention each may have a base material particle and a conductive part disposed on a surface of the base material particle.

FIG. 2 is a sectional view showing the particle according to the second embodiment of the present invention.

A particle 11 shown in FIG. 2 is a particle having a conductive part. The particle 11 has a base material particle 12, and a conductive part 13. The conductive part 13 is disposed on a surface of the base material particle 12. The conductive part 13 is in contact with a surface of the base material particle 12. The particle 11 is a coated particle in which a surface of the base material particle 12 is coated with the conductive part 13. In the particle 11, the conductive part 13 is a single-layered conductive part (conductive layer).

FIG. 3 is a sectional view showing the particle according to the third embodiment of the present invention.

A particle 21 shown in FIG. 3 is a conductive particle having a conductive part. The particle 21 has a base material particle 12, and a conductive part 22. The conductive part 22 as a whole has a first conductive part 22A on the base material particle 12 side, and a second conductive part 22B on the opposite side of the base material particle 12 side.

As compared the particle 11 with the particle 21, only the conductive part is different from each other. That is, in the particle 11, the conductive part 13 having a single-layer structure is formed, but in the particle 21, a two-layer structure of a first conductive part 22A and a second conductive part 22B is formed. The first conductive part 22A and the second conductive part 22B are formed as separate conductive parts. In the particle 21, the conductive part 22 is a multi-layered conductive part (conductive layer).

The first conductive part 22A is disposed on a surface of the base material particle 12. The first conductive part 22A is disposed between the base material particle 12 and the second conductive part 22B. The first conductive part 22A is in contact with the base material particle 12. Therefore, the first conductive part 22A is disposed on a surface of the base material particle 12, and the second conductive part 22B is disposed on a surface of the first conductive part 22A.

The particles 1, 11, and 21 each have no protrusions on the outer surface thereof. The particles 1, 11, and 21 each are spherical.

As the particles 1, 11, and 21, the particles according to the present invention each may also have no protrusions on the outer surface thereof, may also have no protrusions on the outer surface of the conductive part, or may also be spherical.

It is preferred that in the particles, the number of aggregated particles per million particles of the above particles is 100 or less. The aggregated particles are particles in which one particle is in contact with at least one other particle. For example, when three aggregates in each of which three particles are aggregated (aggregate of three particles) are included per million particles of the above particles, the number of aggregated particles per million particles of the above particles is 9. As the measurement method of the number of the aggregated particles, a method in which the aggregated particles are counted using a microscope set at a magnification at which around 50,000 particles are observed in one field of view, and the number of aggregated particles is measured as the total of 20 fields of view, or the like can be mentioned.

As the method for setting the number of aggregated particles to be 100 or less per million particles of the above particles, for example, a method in which the above particles each are made into a form of a conductive particle having the above-described conductive part, a method in which particles each are made into a form of a particle on a surface of which continuous or discontinuous coated part (coated layer) is provided for suppressing the aggregation, a method for modifying a surface of a particle with a crosslinkable compound, or the like can be mentioned.

As the method for forming the continuous coated part described above, for example, a method in which a particle is coated with a resin having a hardness higher than that of the particle before the coated part is formed thereon can be mentioned. As the resin that is a material for the coated part, a resin similar to the material for the particles A and base material particles described later, a hydrophilic resin, or the like can be mentioned. The resin that is a material for the coated part is preferably a divinylbenzene-styrene copolymer, polyvinyl alcohol, polyvinyl pyrrolidone, or polyacrylic acid.

As the method for forming the discontinuous coated part described above, for example, a method in which fine particles are deposited on a surface of the particle before the coated part is formed thereon to coat the particle can be mentioned. As the fine particles that are a material for the coated part, inorganic fine particles of silica, titania, alumina, zirconia, magnesium oxide, zinc oxide, or the like; resin fine particles; and organic-inorganic hybrid fine particles; or the like can be mentioned.

As the method for modifying a surface of a particle with a crosslinkable compound, for example, a method in which a polyfunctional silane coupling agent or a polyfunctional carboxylic acid is reacted with the multiple hydroxyl groups that are present on a surface of a particle, or the like can be mentioned.

Since it is preferred that the particles be not thermally decomposed in the connection part, it is preferred that the particles have a thermal decomposition temperature of 200° C. or more. The thermal decomposition temperature of the particles is preferably 220° C. or more, more preferably 250° C. or more, and furthermore preferably 300° C. or more. Note that when the particle has a base material particle and a conductive part, a temperature at which first thermal decomposition is generated in either one of the base material particle and the conductive part is defined as the thermal decomposition temperature of the particle.

Hereinafter, other details of particles will be described. Note that in the following description, the expression "(meth)acrylic" means one or both of "acrylic" and "methacrylic", the expression "(meth)acrylate" means one or both of "acrylate" and "methacrylate", and the expression "(meth)acryloyl" means one or both of "acryloyl" and "methacryloyl". The expression "(un)saturated" means either saturated or unsaturated.

[Particle having no Conductive Part and Base Material Particle]

In the particle according to the present invention, a particle having no conductive part is referred to as a particle A. The particle according to the present invention may have a base material particle and a conductive part disposed on a surface of the base material particle.

The 10% K value of the particle can also be adjusted by the characteristics of the particle A and the base material particle. The particle A and the base material particle may not have pores, may have pores, may have a single pore, or may be porous.

As the particle A and the base material particle, a resin particle, an inorganic particle excluding a metal particle, an organic-inorganic hybrid particle, or the like can be mentioned. The particle A and the base material particle may be a core-shell particle provided with a core and a shell disposed on a surface of the core. The core may be an organic core. The shell may be an inorganic shell. Each of the particle A and the base material particle are preferably a particle excluding a metal particle, and more preferably a resin particle, an inorganic particle excluding a metal particle, or an organic-inorganic hybrid particle. A resin particle or an organic-inorganic hybrid particle is particularly preferred because of being more excellent effect of the present invention.

From the viewpoint of further suppressing the occurrence of cracking or peeling during a thermal cycle, it is preferred that the particle A and the base material particle each are a resin particle. Examples of the resin include, for example, polyolefin, polyene, poly(meth)acrylic acid ester, and polysiloxane.

Examples of the material for the particle A and the base material particle include, for example, a vinyl compound, a (meth)acrylic compound, an α-olefin compound, a diene compound, a silicone compound, and an epoxy compound. From the viewpoint of further suppressing the occurrence of cracking or peeling during a thermal cycle, the material for the particle A and the base material particle is preferably a vinyl compound, a (meth)acrylic compound, an α-olefin compound, a diene compound, or a silicone compound, and more preferably a vinyl compound, a (meth)acrylic compound, a diene compound, or a silicone compound. When the particle has no conductive part, the material for the particle is preferably a vinyl compound, a (meth)acrylic compound, an α-olefin compound, a diene compound, or a silicone compound, and more preferably a vinyl compound, a (meth)acrylic compound, a diene compound, or a silicone compound. When the particle has a base material particle and a conductive part, the material for the base material particle is preferably a vinyl compound, a (meth)acrylic compound, an α-olefin compound, a diene compound, or a silicone compound, and more preferably a vinyl compound, a (meth)acrylic compound, a diene compound, or a silicone compound.

With the use of the above material, as the method for obtaining the above particle A and base material particle, for example, a method of radical polymerization, ionic polymerization, coordination polymerization, ring-opening polymerization, isomerization polymerization, cyclic polymerization, elimination polymerization, polyaddition, polycondensation, or addition condensation, or the like can be mentioned.

When the particle A and the base material particle are obtained by polymerizing a polymerizable monomer having an ethylenically unsaturated group, from the viewpoint of increasing the heat resistance, a compound having a fluorene skeleton (hereinafter, referred to as a "fluorene compound") can be used as the polymerizable monomer having an ethylenically unsaturated group. The fluorene skeleton may be present at a position other than the terminal, may be present at the terminal, or may be present in the side chain.

As the fluorene compound, a compound having a bisaryl fluorene skeleton, or the like can be mentioned.

The compound having a bisaryl fluorene skeleton is a compound in which two aryl groups are bonded to a 5-membered ring of a fluorene skeleton. Further, the aryl group may have a (meth)acryloyl group or a vinyl group. For example, as the group bonded to a benzene ring, the aryl group may have —O($C_2H_4O$)$_m$COCH=$CH_2$ group (m is an integer of 1 to 13), —O($C_2H_4O$)$_m$COCH=CHCH$_3$ group (m is an integer of 1 to 13), —O—$C_2H_4$O—COCH=$CH_2$ group, —O—$C_2H_4$O—COCH=CHCH$_3$ group, —O—$CH_2$—CH=$CH_2$ group, or the like. The groups described above may be bonded to a p-position to the bonding site of the fluorene skeleton of the benzene ring in the aryl group.

As a specific example of the fluorene compound, a compound represented by the following formula (1), or the like can be mentioned.

[Chemical formula 1]

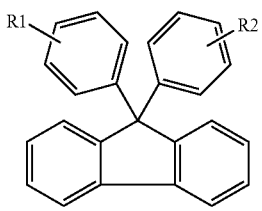

(1)

In the above formula (1), R1 and R2 each represent a hydrogen atom, —O($C_2H_4O$)$_m$COCH=$CH_2$ group (m is an integer of 1 to 13), —O($C_2H_4O$)$_m$COCH=CHCH$_3$ group (m is an integer of 1 to 13), —O—$C_2H_4$O—COCH=$CH_2$ group, —O—$C_2H_4$O—COCH=CHCH$_3$ group, or —O—$CH_2$—CH=$CH_2$ group.

As a commercially available product of the fluorene compound, "OGSOL EA-0300" manufactured by Osaka Gas Chemicals Co., Ltd., and "9,9'-bis(4-allyloxyphenyl)fluorene" manufactured by TOKYO CHEMICAL INDUSTRY CO., LTD., or the like can be mentioned.

When the material for the particle A and base material particle is obtained by metathesis polymerization, a polymer of a metathesis polymerizable monomer, and a metathesis polymerizable compound such as a metathesis polymerizable oligomer are suitably used. For example, by subjecting the metathesis polymerizable compound to ring-opening polymerization in the presence of a catalyst, a metathesis polymerization compound is obtained.

The metathesis polymerizable compound has metathesis polymerization activity. The metathesis polymerizable compound is not particularly limited, and is preferably a cyclic unsaturated compound from the viewpoint of the polymerization reaction activity. The metathesis polymerizable compound may also be a functional group-containing compound. Examples of the functional group-containing compound include, for example, a compound with a functional group such as a hydroxyl group, a carboxyl group, an amino group, an ester group, an acetoxy group, an alkoxy group, a halogen group, a carbonyl group, a mercapto group, an epoxy group, a silyl group, an oxazoline group, a sulfonic acid group, a maleimide group, an azlactone group, and a vinyl group. The functional group in the functional group-containing compound may also be a polar functional group, or may also be a non-polar functional group.

As the cyclic unsaturated compound, a monocyclic olefin such as cyclobutene, cyclopentene, cyclohexene, cyclooctene, or cyclooctadiene, or a derivative thereof; a polycyclic olefin such as 2-norbornene, 2,5-norbornadiene, 5-methyl-2-norbornene, 5-ethylidene-2-norbornene, 5-phenylnorbornene, dicyclopentadiene, dihydrodicyclopentadien, tetracyclodcdecene, tricyclopentadiene, or tetracyclopentadiene, or a derivative thereof; a hetero atom-containing cycloolefin such as 2,3-dihydrofuran, exo-3,6-epoxy-1,2,3,6-tetrahydrophthalic anhydride, 9-oxabicyclo[6.1.0]non-4-ene, exo-N-methyl-7-oxabicyclo[2.2.1]hept-5-ene-2,3-dicarboximide, or 1,4-dihydro-1,4-epoxynaphthalene; or the like is suitably used. The cyclic unsaturated compounds described above may be used singly, or two or more kinds thereof in combination.

From the viewpoint of the reactivity and the cost, the metathesis polymerizable compound is preferably cyclooctadiene, 2-norbornene, or dicyclopentadiene, or a derivative thereof.

It is preferred that the catalyst used for polymerization of the metathesis polymerizable compound is an organic metal complex catalyst. Examples of the catalyst used for polymerization of the metathesis polymerizable compound include a chloride having any one of the metals selected from Ti, V, Cr, Zr, Nb, Mo, Ru, Hf, Ta, W, Re, Os, or Ir as the central metal; an alkylene complex; a vinylidene complex; a carbene complex such as allenylidene; and a metathesis reactive complex such as a carbyne complex. A catalyst in which the central metal is ruthenium (Ru) is preferred.

Further, the metathesis polymerizable compound can be polymerized by a known polymerization method.

When the metathesis polymerization compound is used, as the method for easily adjusting the 10% K value to a desired value, a method in which hydrogenation reaction is performed after ring-opening polymerization at the time of synthesis can be mentioned. Note that the method of hydrogenation reaction is a known method. For example, by using a Wilkinson complex, cobalt acetate/triethylaluminum, nickel acetylacetate/triisobutylaluminum, palladium-carbon, a ruthenium complex, ruthenium-carbon, nickel-kieselguhr or the like, the hydrogenation reaction can be performed.

Examples of the material for the particle A and the base material particle include a condensate obtained from one or more kinds of the compounds of an (un)saturated hydrocarbon, an aromatic hydrocarbon, an (un)saturated fatty acid, an aromatic carboxylic acid, an (un)saturated ketone, an aromatic ketone, an (un)saturated alcohol, an aromatic alcohol, an (un)saturated amine, an aromatic amine, an (un)saturated thiol, an aromatic thiol, and an organic silicon compound, and a polymer obtained from one or more kinds of those compounds.

Examples of the condensate and the polymer include, for example, a polyolefin resin of polyethylene, polypropylene, polystyrene, polyvinyl chloride, polyvinylidene chloride, polyisobutylene, polybutadiene, or the like; an acrylic resin of polymethyl methacrylate, polymethyl acrylate, or the like; polyalkylene terephthalate, polycarbonate, polyamide, a phenol formaldehyde resin, a melamine formaldehyde resin, a benzoguanamine formaldehyde resin, a urea formaldehyde resin, a phenol resin, a melaraine resin, a benzoguanamine resin, a urea resin, an epoxy resin, an unsaturated polyester resin, a saturated polyester resin, polysulfone, polyphenylene oxide, polyacetal, polyimide, polyamideimide, polyether ether ketone, polyethersulfone, and a polymer obtained by polymerizing various polymerizable monomers having an ethylenically unsaturated group singly or two or more kinds thereof in combination. Since the hardness of the particle A and the base material particle can be easily controlled within a suitable range, the resin for forming the resin particle is preferably a polymer obtained by polymerizing polymerizable monomers having multiple ethylenically unsaturated groups singly or two or more kinds thereof in combination.

When the particle A and the base material particle are obtained by polymerization such as radical polymerization, ionic polymerization or coordination polymerization, a polymerizable monomer having an ethylenically unsaturated group is suitably used. As long as the polymerizable monomer having an ethylenically unsaturated group has an ethylenically unsaturated group, the molecular weight, the number of ethylenically unsaturated groups, and the like are not particularly limited. Examples of the polymerizable monomer having an ethylenically unsaturated group include a non-crosslinkable monomer, and a crosslinkable monomer.

Examples of the non-crosslinkable monomer include, for example, as the vinyl compound, a styrene-based monomer such as styrene, α-methyl styrene, and chlorostyrene; a vinyl ether compound such as methyl vinyl ether, ethyl vinyl ether, and propyl vinyl ether; an acid vinyl ester compound such as vinyl acetate, vinyl butylate, vinyl laurate, and vinyl stearate; and a halogen-containing monomer such as vinyl chloride, and vinyl fluoride: as the (meth)acrylic compound, an alkyl (meth)acrylate compound such as methyl (meth)acrylate, ethyl (meth)acrylate, propyl (meth)acrylate, butyl (meth)acrylate, 2-ethylhexyl (meth)acrylate, lauryl (meth)acrylate, cetyl (meth)acrylate, stearyl (meth)acrylate, cyclohexyl (meth)acrylate, and isobornyl (meth)acrylate; an oxygen atom-containing (meth)acrylate compound such as 2-hydroxyethyl (meth)acrylate, glycerol (meth)acrylate, polyoxyethylene (meth)acrylate, and glycidyl (meth)acrylate; a nitrile-containing monomer such as (meth)acrylonitrile; and a halogen-containing (meth)acrylate compound such as trifluoromethyl (meth)acrylate, and pentafluoroethyl (meth)acrylate: as the α-olefin compound, an olefin compound such as diisobutylene, isobutylene, LINEALENE, ethylene, and propylene: and as the conjugated diene compound, isoprene, butadiene, and the like.

Examples of the crosslinkable monomer include, for example, as the vinyl compound, a vinyl-based monomer such as divinylbenzene, 1,4-divinyloxybutane, divinyl sulfone, and 9,9'-bis(4-allyloxyphenyl) fluorene: as the (meth)acrylic compound, a polyfunctional (meth)acrylate compound such as tetramethylolmethane tetra(meth)acrylate, tetramethylolmethane tri(meth)acrylate, tetramethylolmethane di(meth)acrylate, trimethylolpropane tri(meth)acrylate, dipentaerythritol hexa(meth)acrylate, dipentaerythritol penta(meth)acrylate, glycerol tri(meth)acrylate, glycerol di(meth)acrylate, (poly)ethylene glycol di(meth)acrylate, (poly)propylene glycol di(meth)acrylate, (poly)tetramethylene glycol di(meth)acrylate, and 1,4-butanediol di(meth)acrylate: as the allyl compound, triallyl (iso)cyanurate, triallyl trimellitate, diallyl phthalate, diallyl acrylamide, and diallyl ether: and as the silicone compound, a silane alkoxide compound such as tetramethoxysilane, tetraethoxysilane, methyltrimethoxysilane, methyltriethoxysilane, ethyltrimethoxysilane, ethyltriethoxysilane, isopropyl trimethoxysilane, isobutyltrimethoxysilane, cyclohexyl trimethoxysilane, n-hexyitrimethoxysilane, n-octyltriethoxysilane, n-decyltrimethoxysilane, phenyltrimethoxysilane, dimethyldimethoxysilane, dimethyldiethoxysilane, diisopropyldimethoxysilane, trimethoxysilyl styrene, γ-(meth)acryloxypropyltrimethoxysilane, 1,3-divinyltetramethyldisiloxane, methylphenyldimethoxysilane, and diphenyldimethoxysilane; a polymerizable double bond-containing silane alkoxide such as vinyltrimethoxysilane, vinyltriethoxysilane, dimethoxymethylvinylsilane, dimethoxyethylvinylsilane, diethoxymethylvinylsilane, diethoxyethylvinylsilane, ethylmethyldivinylsilane, methylvinyldimethoxysilane, ethylvinyldiethoxysilane, methylvinyldiethoxysilane, ethylvinyldiethoxysilane, p-styryltrimethoxysilane, 3-methacryloxypropylmethyldimethoxysilane, 3-methacryloxypropyl trimethoxy silane, 3-methacryloxypropylmethyldiethoxysilane, 3-methacryloxypropyl triethoxy silane, and 3-acryloxypropyltrimethoxysilane; a cyclic siloxane such as decamethylcyclopentasiloxane; a modified (reactive) silicone oil such as one-terminal silicone oil, both-terminal silicone oil, and side-chain type silicone oil; and a carboxyl group-containing monomer such as (meth)acrylic acid, maleic acid, and maleic anhydride.

By polymerizing the polymerizable monomer having an ethylenically unsaturated group by a known method, the resin particle can be obtained. As this method, for example, a method in which suspension polymerization is performed in the presence of a radical polymerization initiator, a method in which non-crosslinked seed particles are swollen with monomers and a radical polymerization initiator and the monomers are polymerized, or the like can be mentioned.

As the material for the particle A and the base material particle, polysiloxane is suitably used. The polysiloxane is a polymerization product of a silane compound and is obtained by polymerization of a silane compound.

Examples of the silane compound include a silane alkoxide compound such as tetramethoxysilane, tetraethoxysilane, methyltrimethoxysilane, methyltriethoxysilane, ethyltrimethoxysilane, ethyltriethoxysilane, isopropyitrimethoxysilane, isobutyltrimethoxysilane, cyclohexyl trimethoxysilane, n-hexyltrimethoxysilane, n-octyltriethoxysilane, n-decyltrimethoxysilane, phenyltrimethoxysilane, dimethyldimethoxysilane, dimethyidlethoxysilane, diisopropyldimethoxysilane, trimethoxysilyl styrene, γ-(meth)acryloxypropyltrimethoxysilane, 1,3-divinyltetramethyldisiloxane, methylphenyldimethoxysilane, and diphenyldimethoxysilane; and a cyclic siloxane such as decamethylcyclopentasiloxane.

From the viewpoint of imparting heat resistance to the material for the particle A and the base material particle, an ethylenically unsaturated group-containing polysiloxane can be used. Examples of the commercially available product of the ethylenically unsaturated group-containing polysiloxane include, for example, Silaplane FM-0711, Silaplane FM-0721, and Silaplane FM-0725 manufactured by JNC Corporation; X-22-174DX, X-22-2426, X-22-2475, X-22-164, X-22-164AS, X-22-164A, X-22-164B, X-22-164C, and X-22-164E manufactured by Shin-Etsu Chemical Co., Ltd.; MCS-M11, and RTT-1011 manufactured by GELEST, INC.; and AK-5, AK-30, AK-32, and HK-20 manufactured by TOAGOSEI CO., LTD.

When the particle A and the base material particle are an inorganic particle excluding a metal particle or an organic-inorganic hybrid particle, as the inorganic substance that is a material for the particle A and the base material particle, silica, carbon black, and the like can be mentioned. It is preferred that the inorganic substance is not a metal. As the particle formed of silica, it is not particularly limited, and for example, a particle that is obtained by hydrolyzing a silicon compound having two or more hydrolyzable alkoxysilyl groups to form a crosslinked polymer particle, and then by firing the formed crosslinked polymer particle if necessary can be mentioned. As the organic-inorganic hybrid particle, for example, an organic-inorganic hybrid particle formed of a crosslinked alkoxysilyl polymer and an acrylic resin, or the like can be mentioned.

[Conductive Part]

The material for the conductive part is not particularly limited. It is preferred that the material for the conductive part contains a metal. Examples of the metal include, for example, gold, silver, palladium, copper, platinum, zinc, iron, tin, lead, ruthenium, aluminum, cobalt, indium, nickel, chrome, titanium, antimony, bismuth, thallium, germanium, cadmium, and silicon, and an alloy thereof. Further, examples of the metal include a tin-doped indium oxide (ITO), and solder. It is preferred that the material for the conductive part contains nickel, gold, silver, copper, or tin because the connection resistance can further be reduced.

The conductive part may be formed of one layer. The conductive part may be formed of multiple layers.

The method for forming the conductive part on a surface of the base material particle is not particularly limited. Examples of the method for forming the conductive part include, for example, a method by electroless plating, a method by electroplating, a method by physical vapor deposition, and a method in which a paste containing metal powder or metal powder and a binder is coated on a surface of a base material particle. A method by electroless plating is preferred because formation of the conductive part is simple and easy. As the method by physical vapor deposition, a method by vacuum vapor deposition, ion plating, or ion sputtering can be mentioned.

The thickness of the conductive part (thickness of the entire conductive part) is preferably 0.5 nm or more, and more preferably 10 nm or more, and is preferably 10 µm or less, more preferably 1 µm or less, furthermore preferably 500 nm or less, and particularly preferably 300 nm or less. The thickness of the conductive part is the thickness of the entire conductive layer when the conductive part is multi-layered. When the thickness of the conductive part is the above lower limit or more and the above upper limit or less, sufficient conductivity is obtained, and the particle does not become extremely hard.

[Others]

When a connection structure described later is prepared, and the like, for the purpose of improving the adhesion with the metal atom-containing particles described later, a method in which fine metal particles having easily metal-diffusing metal atom-containing particles are disposed as a sintering accelerator on a surface of a particle, or a method in which flux is disposed as a sintering accelerator on a surface of a particle may be employed. The particle may have fine metal particles, or may have flux.

As the fine metal particles acting as a sintering accelerator, fine metal particles of gold, silver, tin, copper, germanium, indium, palladium, zinc, or the like can be mentioned. The fine metal particles may be used singly, or two or more kinds thereof in combination. Further, the fine metal particles may also be an alloy of two or more kinds of metals. In this case, a particle onto which fine metal particles are disposed, and a sintered body constituted of metal atom-containing particles are easier to come into contact with each other, and the adhesion is improved.

As the method for disposing fine metal particles on a surface of a particle as a sintering accelerator, for example, a method in which fine metal particles are added into a dispersion of particles, and the fine metal particles are accumulated to be deposited on a surface of the particle by Van der Waals force, a method in which fine metal particles are added into a container containing particles, and the fine metal particles are deposited on a surface of the particle by mechanical action such as rotation of the container, a method in which metal nanocolloids are added into a dispersion of particles, the metal nanocolloids are accumulated on a surface of the particle by a chemical bond, the metal nanocolloids are reduced by a reducing agent, and the reduced metal nanocolloids are metallized to deposit fine metal particles on a surface of the particle, or the like can be mentioned. From the viewpoint of easy control of the amount of fine metal particles to be deposited, a method in which fine metal particles are accumulated to be deposited on a surface of a particle in a dispersion is preferred.

Examples of the flux acting as a sintering accelerator include resin-based flux, organic flux, and inorganic flux. As the resin-based flux, rosin that has abietic acid, palustric acid, dehydroabietic acid, isopimaric acid, neoabietic acid, or pimaric acid as the main component can be mentioned. As the organic flux, aliphatic carboxylic acid, and aromatic carboxylic acid can be mentioned. As the inorganic flux, a halide such as ammonium bromide, and ammonium chloride can be mentioned. The flux may be used singly, or two or more kinds thereof in combination. By the flux component disposed on a surface of a particle, an oxide film on a surface of a metal atom-containing particle is removed, the sintering reaction is promoted on a surface of a particle, the particle and the sintered body are easier to come into contact with each other, and the adhesion is improved.

As the method in which flux is disposed as a sintering accelerator on a surface of a particle, a method in which flux is contained into the above-described coated part, or the like can be mentioned.

(Connecting Material)

The connecting material according to the present invention is used for forming a connection part that connects two members to be connected. The connecting material according to the present invention contains the above-described particle, and a resin or metal atom-containing particles. In this case, the connecting material contains at least one of the resin and the metal atom-containing particles. The connecting material preferably contains the metal atom-containing particles. It is preferred that the connecting material according to the present invention is used for forming the connection part by melting the metal atom-containing particles followed by solidifying the metal atom-containing particles. In the metal atom-containing particles, the particles according to the present invention are not contained.

The thermal decomposition temperature of the particles is preferably higher than a melting point of the metal atom-containing particles. The thermal decomposition temperature of the particles is preferably higher than a melting point of the metal atom-containing particles by 10° C. or more, more preferably higher than the melting point by 30° C. or more, and most preferably higher than the melting point by 50° C. or more.

Examples of the metal atom-containing particles include metal particles, and metal compound particles. The metal compound particles contain metal atoms, and atoms other than the metal atoms. Specific examples of the metal compound particles include metal oxide particles, metal carbonate particles, metal carhoxylate particles, and metal complex particles. It is preferred that the metal compound particles are metal oxide particles. For example, the metal oxide particles are sintered after being formed into metal particles by heating at the time of connection in the presence of a reducing agent. The metal oxide particles are a precursor of metal particles. As the metal carboxylate particles, metal acetate particles, or the like can be mentioned.

As the metal constituting the metal particles and the metal oxide particles, silver, copper, gold or the like are mentioned. Silver or copper is preferred, and silver is particularly preferred. Accordingly, the metal particles are preferably silver particles or copper particles, and more preferably silver particles. The metal oxide particles are preferably silver oxide particles or copper oxide particles, and more preferably silver oxide particles When the silver particles and silver oxide particles are used, the residue is small after connection, and the volume reduction rate is also extremely small. Examples of the silver oxide in the silver oxide particles include $Ag_2O$, and $AgO$.

It is preferred that the average particle diameter of the metal atom-containing particles is 10 nm or more and 10 μm or less. Further, from the viewpoint of increasing the connection strength of the members to be connected, it is preferred that two or more kinds of metal atom-containing particles having different average particle diameters are contained. When two or more kinds of metal atom-containing particles having different average particle diameters are contained, the average particle diameter of the metal atom-containing particles having a small average particle diameter is preferably 10 nm or more, and is preferably 100 nm or less. The average particle diameter of the metal atom-containing particles having a large average particle diameter is preferably 1 μm or more, and is preferably 10 μm or less. The ratio of the mixing amount of the metal atom-containing particles having a small average particle diameter to the mixing amount of the metal atom-containing particles having a large average particle diameter is preferably ⅑ or more and 9 or less. Further, the average particle diameter of the metal atom-containing particles is determined by observing the metal atom-containing particles with a scanning electron microscope, and by arithmetically averaging the maximum diameters of 50 particles arbitrarily selected in the observed image.

The metal atom-containing particles are preferably sintered by heating at less than 400° C. The temperature at which the metal atom-containing particles are sintered (sintering temperature) is more preferably 350° C. or less, and is preferably 300° C. or more. When the temperature at which the metal atom-containing particles are sintered is the above upper limit or more and less than the above upper limit, the sintering can be performed efficiently, further the energy necessary for the sintering is reduced, and the environmental load can be reduced.

When the metal atom-containing particles are metal oxide particles, it is preferred to use a reducing agent. Examples of the reducing agent include an alcohol compound (compound with an alcoholic hydroxyl group), a carboxylic acid compound (compound with a carboxyl group), and an amine compound (compound with an amino group). The reducing agent may be used singly, or two or more kinds thereof in combination.

As the above alcohol compound, alkyl alcohol can be mentioned. Specific examples of the alcohol compound include, for example, ethanol, propanol, butyl alcohol, pentyl alcohol, hexyl alcohol, heptyl alcohol, octyl alcohol, nonyl alcohol, decyl alcohol, undecyl alcohol, dodecyl alcohol, tridecyl alcohol, tetradecyl alcohol, pentadecyl alcohol, hexadecyl alcohol, heptadecyl alcohol, octadecyl alcohol, nonadecyl alcohol, and icosyl alcohol. Further, as the alcohol compound, not only a primary alcohol-type compound, but also a secondary alcohol-type compound, a tertiary alcohol-type compound, alkanediol, or an alcohol compound having a cyclic structure can be used. Furthermore, as the alcohol compound, a compound having a large number of alcohol groups, such as ethylene glycol, and triethylene glycol may also be used. Moreover, as the alcohol compound, a compound such as citric acid, ascorbic acid, and glucose may also be used.

As the above carboxylic acid compound, alkylcarboxylic acid, or the like can be mentioned. Specific examples of the carboxylic acid compound include butanoic acid, pentanoic acid, hexanoic acid, heptanoic acid, octanoic acid, nonanoic acid, decanoic acid, undecanoic acid, dodecanoic acid, tridecanoic acid, tetradecanoic acid, pentadecanoic acid, hexadecanoic acid, heptadecanoic acid, octadecanoic acid, nonadecanoic acid, and icosanoic acid. Further, as the carboxylic acid compound, not only a primary carboxylic acid-type compound, but also a secondary carboxylic acid-type compound, a tertiary carboxylic acid-type compound, dicarboxylic acid, or a carboxyl compound having a cyclic structure can be used.

As the above amine compound, alkyl amine, or the like can be mentioned. Specific examples of the amine compound include butylamine, pentylamine, hexylamine, heptylamine, octylamine, nonylamine, decylamine, undecylamine, dodecylamine, tridecylamine, tetradecylamine, pentadecylamine, hexadecylamine, heptadecylamine, octadecylamine, nonadecylamine, and icodecylamine. Further, the amine compound may have a branch structure. Examples of the amine compound having a branch structure include 2-ethylhexylamine, and 1,5-dimethylhexylamine. As the amine compound, not only a primary amine-type compound, but also a secondary amine-type compound, a tertiary amine-type compound, or an amine compound having a cyclic structure can be used.

The above reducing agent may also be an organic substance having an aldehyde group, an ester group, a sulfonyl group, a ketone group, or the like, or may also be an organic substance such as a metal carboxylate. The metal carboxylate is used as a precursor of metal particles, and is also used as a reducing agent for metal oxide particles because of containing an organic substance.

The content of the reducing agent based on 100 parts by weight of the metal oxide particles is preferably 1 part by weight or more, and more preferably 10 parts by weight or more, and is preferably 1000 parts by weight or less, more preferably 500 parts by weight or less, and furthermore preferably 100 parts by weight or less. When the content of the reducing agent is the above lower limit or more, the metal atom-containing particles can be sintered more densely. As a result, heat dissipation and heat resistance in a connection part can also be increased.

When a reducing agent having a melting point lower than the sintering temperature (connection temperature) of the metal atom-containing particles is used, there is a tendency that aggregation is generated at the time of connection, and voids are easily generated in the connection part. By using the metal carboxylate, the metal carboxylate is not melted by heating at the time of connection, therefore, the occurrence of voids can be suppressed. Further, in addition to the metal carboxylate, a metal compound containing an organic substance may be used as the reducing agent.

From the viewpoint of further suppressing the occurrence of cracking or peeling during a thermal cycle, it is preferred that the connecting material according to the present invention contains a resin. The resin is not particularly limited. The resin preferably contains a thermoplastic resin, or a curable resin, and more preferably contains a curable resin. Examples of the curable resin include a photocurable resin, and a thermosetting resin. The photocurable resin preferably contains a photocurable resin, and a photoinitiator. The thermosetting resin preferably contains a thermosetting resin, and a heat curing agent. Examples of the resin include, for example, a vinyl resin, a thermoplastic resin, a curable resin, a thermoplastic block copolymer, and elastomer. The resin may be used singly, or two or more kinds thereof in combination.

Examples of the vinyl resin include, for example, a vinyl acetate resin, an acrylic resin, and a styrene resin. Examples of the thermoplastic resin include, for example, a polyolefin resin, an ethylene-vinyl acetate copolymer, and a polyamide resin. Examples of the curable resin include, for example, an epoxy resin, a urethane resin, a polyimide resin, and an unsaturated polyester resin. Further, the curable resin may also be a room temperature curing-type resin, a heat curing-type resin, a photo curing-type resin, or a moisture curing-type resin. Examples of the thermoplastic block copolymer include, for example, a styrene-butadiene-styrene block copolymer, a styrene-isoprene-styrene block copolymer, a hydrogenated product of a styrene-butadiene-styrene block copolymer, and a hydrogenated product of a styrene-isoprene-styrene block copolymer. Examples of the elastomer include, for example, styrene-butadiene copolymer rubber, and acrylonitrile-styrene block copolymer rubber.

From the viewpoint of further suppressing the occurrence of cracking or peeling during a thermal cycle, it is preferred that the connecting material according to the present invention contains an epoxy resin.

Since the effect of the particles of the present invention is effectively exhibited, when the connecting material contains the metal atom-containing particles, the content of the metal atom-containing particles in the connecting material is preferably larger than the content of the particles according to the present invention, more preferably larger than the content of the particles by 10% by weight or more, and furthermore preferably larger than the content of the particles by 20% by weight or more.

In 100% by weight of the component excluding the dispersant of the connecting material, the content of the particles according to the present invention is preferably 0.1% by weight or more, and more preferably 1% by weight or more, and is preferably 20% by weight or less, and more preferably 10% by weight or less. When the content of the particles is the above lower limit or more and the above upper limit or less, the occurrence of cracking or peeling during a thermal cycle can be further suppressed. The above dispersant is removed by volatilization.

When the connecting material contains the metal atom-containing particles, in 100% by weight of the component excluding a dispersant of the connecting material, the content of the metal atom-containing particles is preferably 70% by weight or more, and more preferably 80% by weight or more, and is preferably 98% by weight or less, and more preferably 95% by weight or less. When the content of the metal atom-containing particles is the above lower limit or more and the above upper limit or less, the connection resistance is further reduced.

When the connecting material contains a resin, in 100% by weight of the component excluding a dispersant of the connecting material, the content of the resin is preferably 1% by weight or more, and more preferably 5% by weight or more, and is preferably 20% by weight or less, and more preferably 15% by weight or less. When the content of the resin is the above lower limit or more and the above upper limit or less, the occurrence of cracking or peeling during a thermal cycle can be further suppressed.

(Connection Structure)

The connection structure according to the present invention is provided with a first member to be connected, a second member to be connected, and a connection part that connects the first and second members to be connected. In the connection structure according to the present invention, the connection part is formed of the above connecting material. A material for the connection part is the above connecting material.

FIG. 4 is a front sectional view schematically showing a connection structure using the particle according to the second embodiment of the present invention.

A connection structure 51 shown in FIG. 4 is provided with a first member to be connected 52, a second member to be connected 53, and a connection part 54 connecting the first and second members to be connected 52 and 53. In the connection structure 51, a particle 11 shown in FIG. 2 is used.

In the connection part 54, one particle 11 is in contact with both of the first and second members to be connected 52 and 53. All of the particles 11 may not be in contact with both of the first and second members to be connected 52 and 53.

In the connection part 54, particles 11, stress relaxation particles 61, and a metal connection part 62 are contained. One stress relaxation particle 61 is not in contact with both of the first and second members to be connected 52 and 53. The metal connection part 62 is formed by being solidified after melting the metal atom-containing particles. The metal connection part 62 is a molten and solidified product of metal atom-containing particles. The stress relaxation particles 61 may not be used.

The method for producing the connection structure is not particularly limited. As an example of the method for producing the connection structure, a method in which the connecting material is disposed between the first member to be connected and the second member to be connected to obtain a laminated body, and then the laminated body is heated and pressurized, or the like can be mentioned.

Specific examples of the member to be connected include an electronic component such as a semiconductor chip, a capacitor, and a diode, and an electronic component such as a circuit board of a printed board, a flexible printed board, a glass epoxy board, a glass board, or the like. The member to be connected is preferably an electronic component.

At least one of the first member to be connected and the second member to be connected is preferably a semiconductor wafer, or a semiconductor chip. The connection structure is preferably a semiconductor device.

The first member to be connected may have a first electrode on the surface thereof. The second member to be connected may have a second electrode on the surface thereof. As the electrode provided in the member to be connected, a metal electrode such as a gold electrode, a nickel electrode, a tin electrode, an aluminum electrode, a copper electrode, a silver electrode, a titanium electrode, a molybdenum electrode, and a tungsten electrode can be mentioned. When the member to be connected is a flexible printed board, the electrode is preferably a gold electrode, a nickel electrode, a titanium electrode, a tin electrode, or a copper electrode. When the member to be connected is a glass board, the electrode is preferably an aluminum electrode, a titanium electrode, a copper electrode, a molybdenum electrode, or a tungsten electrode. Further, when the electrode is an aluminum electrode, the electrode may be formed of only aluminum, or the electrode may be laminated with an aluminum layer on a surface of a metal oxide layer. Examples of the material for the metal oxide layer include an indium oxide doped with a trivalent metallic element, and a zinc oxide doped with a trivalent metallic element. Examples of the trivalent metallic element include Sn, Al, and Ga.

Hereinafter, the present invention will be specifically described by way of Examples, and Comparative Examples. The present invention is not limited only to the following Examples.

(Material for Particles (Base Material Particles))

1,3-Divinyltetramethyldisiloxane (manufactured by TOKYO CHEMICAL INDUSTRY CO., LTD.)

Dimethyldimethoxysilane ("KBM-22" manufactured by Shin-Etsu Chemical Co., Ltd.)

Methylvinyldimethoxysilane (manufactured by TOKYO CHEMICAL INDUSTRY CO., LTD.)

Methylphenyldimethoxysilane (manufactured by TOKYO CHEMICAL INDUSTRY CO., LTD.)

Methyltrimethoxysilane ("KBM-13" manufactured by Shin-Etsu Chemical Co., Ltd.)

Isoprene (manufactured by Wako Pure Chemical Industries, Ltd.)

Divinylbenzene ("DVB960" manufactured by NIPPON STEEL & SUMIKIN CHEMICAL CO., LTD.)

Polytetramethylene glycol diacrylate ("LIGHT ACRYLATE PTMGA-250" manufactured by KYOEISHA CHEMICAL Co., LTD)

1,4-Butanediol vinyl ether ("BDVE" manufactured by NIPPON CARBIDE INDUSTRIES CO., INC.)

Diisobutylene (manufactured by Wako Pure Chemical Industries, Ltd.)

Fluorene monomer ("OGSOL, EA-0300" manufactured by Osaka Gas Chemicals Co., Ltd.)

Dicyclopentadiene ("DCPD" manufactured by TOKYO CHEMICAL INDUSTRY CO., LTD.)

(Material other than Particles X of Connecting Material)

Silver particles (having an average particle diameter of 50 nm, and an average particle diameter of 5 μm)

Silver oxide particles (having an average particle diameter of 50 nm, and an average particle diameter of 5 μm)

Copper particles (having an average particle diameter of 50 nm, and an average particle diameter of 5 μm)

Epoxy resin ("EX-201" manufactured by NAGASE & CO., LTD.)

EXAMPLE 1

(1) Preparation of Silicone Oligomer

Into a 100-ml separable flask arranged in a warm bath, 1 part by weight of 1,3-divinyltetramethyldisiloxane (amount to be the % by weight in Table), and 20 parts by weight of a 0.5% by weight p-toluenesulfonic acid aqueous solution were placed. The resultant mixture was stirred at 40° C. for 1 hour, and then into the stirred mixture, 0.05 part by weight of sodium hydrogen carbonate was added. After that, into the mixture, 30 parts by weight of dimethyldimethoxysliane (amount to be the % by weight in Table), and 30 parts by weight of methylvinyidimethoxysilane (amount to be the % by weight in Table) were added, and the resultant mixture was stirred for 1 hour. After that, 1.9 parts by weight of a 10% by weight potassium hydroxide aqueous solution was added to the mixture, the temperature was raised to 85° C., and the reaction was performed by stirring for 10 hours while reducing the pressure with an aspirator. After completion of the reaction, the pressure was returned to normal pressure, the mixture was cooled down to 40° C., 0.2 part by weight of acetic acid was added to the cooled mixture, and the resultant mixture was left to stand in a separating funnel for 12 hours or more. The lower layer after two-layer separation was taken out, and purified by an evaporator to obtain a silicone oligomer.

(2) Preparation of Silicone Particles (Including Organic Polymer)

A solution A in which 0.5 part by weight of tert-butyl-2-ethylperoxyhexanoate (polymerization initiator, "PERBUTYL O" manufactured by NOF CORPORATION) was dissolved in 30 parts by weight of the obtained silicone oligomer was prepared. Further, into 150 parts by weight of ion-exchange water, 0.8 part by weight of polyoxyethylene alkyl phenyl ether (emulsifier), and 80 parts by weight of a 5% by weight aqueous solution of polyvinyl alcohol (polymerization degree: around 2000, saponification degree: 86.5 to 89% by mole, "Gohsenol GH-20" manufactured by The Nippon Synthetic Chemical Industry Co., Ltd.) were mixed, and an aqueous solution B was prepared.

Into a separable flask arranged in a warm bath, the solution A was placed, and then the aqueous solution B was added. After that, by using a Shirasu Porous Glass (SPG) membrane (average fine pore diameter (SPG pore diameter) of 20 μm), emulsification was performed. After that, the temperature was raised to 85° C., and the polymerization was performed for 9 hours. The whole amount of the particles after the polymerization was washed with water by centrifugation, and then the particles were again dispersed in 100 parts by weight of ion-exchanged water to obtain a dispersion C. Next, 0.7 part by weight of colloidal silica ("MP-2040" manufactured by Nissan Chemical Industries, Ltd.) was added to the dispersion C, and then the resultant mixture was freeze-dried to obtain base material particles. The obtained base material particles were subjected to classification operation to obtain particles X.

(3) Preparation of Connecting Material

By blending and mixing 49.5 parts by weight of silver particles having an average particle diameter of 50 nm, 49.5 parts by weight (amount to be the % by weight in Table) of silver particles having an average particle diameter of 5 μm, 1 part by weight (amount to be the % by weight in Table) of the above particles X, and 40 parts by weight of toluene as a solvent, a connecting material was obtained.

(4) Preparation of Connection Structure

As the first member to be connected, a power semiconductor element, was prepared. As the second member to be connected, an aluminum nitride board was prepared.

A connecting material was applied onto the second member to be connected so as to be a thickness of around 30 μm, and a connecting material layer was formed. After that, the first member to be connected was laminated on the connecting material layer, and a laminated body was obtained. By heating the obtained laminated body at 300° C. for 10 minutes under a pressure of 3 MPa, the metal atom-containing particles contained in the connecting material were sintered, and a connection part including a sintered material and particles X was formed, and then the first and second members to be connected were bonded by the sintered material, and a connection structure was obtained.

EXAMPLES 2 TO 9, 15 TO 21, and 24, AND COMPARATIVE EXAMPLES 1, AND 2

Particles X, a connecting material, and a connection structure were prepared in the similar manner as in Example 1 except that the silicone monomer used for the preparation of the silicone oligomer was changed as shown in Tables 1 and 2, the SPG pore diameter was changed as shown in the following Tables 1 and 2, and the constitutions of the particles and the connecting material were changed as shown in Tables 1 and 2.

Note that in Examples 20 and 21, particles having a conductive part shown in Table 2 were prepared.

EXAMPLE 25

A Dispersion C of Example 1 was Prepared.

Based on 100 parts by weight of particles in the dispersion C, 1 part by weight of methyltrimethoxysilane ("KBM-13" manufactured by Shin-Etsu Chemical Co., Ltd.), and an ammonia aqueous solution in such an amount that the concentration of ammonia after the addition was 1% by weight were added, and the resultant mixture was stirred at room temperature for 24 hours, and then the mixture was washed with water to obtain base material particles. The obtained base material particles were subjected to classification operation to obtain particles X.

A connecting material, and a connection structure were prepared in the similar manner as in Example 1 except that the obtained particles X were used.

EXAMPLE 10

Preparation of Isoprene Particles:

A solution A in which 90 parts by weight of isoprene as a monomer, 10 parts by weight of DVB570, and 1 part by weight of benzoyl peroxide ("Nyper BW" manufactured by NOF CORPORATION) as a polymerization initiator were dissolved was prepared.

Further, into 800 parts by weight, of ion-exchange water, 200 parts by weight of a 5% by weight aqueous solution of polyvinyl alcohol (polymerization degree: around 2000, saponification degree: 86.5 to 89% by mole, "Gohsenol GL-03" manufactured by The Nippon Synthetic Chemical Industry Co., Ltd.) was mixed, and an aqueous solution B was prepared.

Into a separable flask arranged in a warm bath, the solution A was placed, and then the aqueous solution B was added. After that, by using a Shirasu Forous Glass (SPG) membrane (average fine pore diameter of around 20 µm), emulsification was performed. After that, the temperature was raised to 90° C., and the polymerization was performed for 10 hours. The whole amount of the particles after the polymerization was washed with water and acetone by centrifugation, and then the obtained base material particles were subjected to classification operation to obtain particles X.

A connecting material, and a connection structure were prepared in the similar manner as in Example 1 except that the obtained particles X were used.

EXAMPLES 11 TO 14

Particles X, a connecting material, and a connection structure were prepared in the similar manner as in Example 1 except that the constitutions of the particles and the connecting material were changed as shown in Tables 1 and 2.

EXAMPLE 22

Preparation of Fluorene Particles:

A solution A in which 100 parts by weight of fluorene monomer ("OGSOL EA-0300" manufactured by Osaka Gas Chemicals Co., Ltd.), and 1 part by weight of tert-butylperoxy-2-ethylhexanoate ("PERBUTYL O" manufactured by NOF CORPORATION) as a polymerization initiator were dissolved was prepared. Particles X, a connecting material, and a connection structure were prepared in the similar manner as in Example 10 except that the solution A in Example 10 was changed to the obtained solution A.

EXAMPLE 23

Preparation of Ring-Opening Metathesis Polymerization (ROMP) Particles:

Synthesis of a ruthenium vinylidene complex compound (compound represented by the formula (2))

5.57 g (9.1 mmol) of dichloro cymene ruthenium ("Ru (p-cymene) C12" manufactured by TOKYO CHEMICAL INDUSTRY CO., LTD.), 18.2 mmol of tricyclohexylphosphine ("PCy3" manufactured by TOKYO CHEMICAL INDUSTRY CO., LTD.), 9.1 mmol of t-butyl acetylene, and 150 ml of toluene were placed into a 300-ml flask, and the reaction was performed at 80° C. for 7 hours under a nitrogen stream. After completion of the reaction, toluene was removed under reduced pressure, and by performing recrystallization from tetrahydrofuran/ethanol, a compound represented by the following formula (2) was obtained.

[Chemical formula 2]

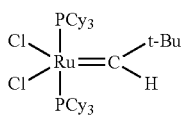

(2)

In the above formula (2), Cy represents a cyclohexyl group.

Metathesis Polymerization Reaction:

A solution in which 304 mg of the compound represented by the formula (2) (1/10000 mol equivalent of dicyclopentadiene ("DCPD" manufactured by TOKYO CHEMICAL INDUSTRY CO., LTD.) was dissolved in 30 mL of toluene was prepared. This solution, a catalyst solution to which 25 g of allyl acetate was added, and 10 mL of toluene for freezing point depression were added and mixed into 500 g of dicyclopentadiene ("DCPD" manufactured by TOKYO CHEMICAL INDUSTRY CO., LTD.), and the obtained mixture was placed in a 5-L separable flask in which 1.5 kg of distilled water was placed.

Using a mechanical stirrer, stirring was performed at 300 rpm, and the reaction was started at 30° C. Three hours after the start of the reaction, it was confirmed that a polymer was obtained, ethyl vinyl ether was added into the reaction mixture to terminate the reaction, and the precipitated solid was separated by filtration and washed twice with 750 mL of methanol. The obtained particles were dispersed in 500 mL of acetone and subjected to classification operation, and then vacuum drying was performed to obtain particles X.

A connecting material, and a connection structure were prepared in the similar manner as in Example 1 except that the obtained particles X were used.

EXAMPLE 26

Particles X of Example 1 were Prepared.

Into 100 parts by weight of a solution containing 5% by weight polyvinyl pyrrolidone, 10 parts by weight of particles X were added, and dispersed by an ultrasonic disperser to obtain a suspension A.

Next, 1 part by weight or metallic silver fine particles (having an average particle diameter of 50 nm, manufactured by Inuisho Precious Metals Co., Ltd.) was added into the suspension A over 3 minutes, and a suspension B containing particles on the surfaces of which metallic silver fine particles were deposited was obtained. After that, particles were taken out by filtering the suspension B, washed with water, and dried, and as a result, particles (designated as particles X of Example 26), on the surfaces of which metallic silver fine particles were disposed, were obtained.

A connecting material, and a connection structure were prepared in the similar manner as in Example 1 except that the obtained particles X were used.

EXAMPLE 27

Particles X of Example 1 were Prepared.

Into 100 parts by weight of an aqueous solution containing a 5% by weight silver nanocolloid solution, 10 parts by weight of particles X were added, the resultant mixture was dispersed by an ultrasonic disperser, and then into the dispersion, 100 parts by weight of a 1% by weight solution of dimethylamine borane was slowly added, and the silver nanocolloid adsorbed onto the surfaces of the particles was reduced and precipitated. After that, particles were taken out by filtration, washed with water, and dried, and as a result, particles (designated as particles X of Example 27), on the surfaces of which metallic silver fine particles were disposed, were obtained.

A connecting material, and a connection structure were prepared in the similar manner as in Example 1 except that the obtained particles X were used.

(Evaluation)

(1) 10% K Value

Using "Fischer Scope H-100" manufactured by FISCHER INSTRUMENTS K.K., the 10% K value of the particles was measured. With regard to the conductive particles, the 10% K value of the particles having a conductive part was measured.

(2) Average Particle Diameter

By observing the particles with a scanning electron microscope, and by arithmetically averaging the maximum diameters of 50 particles arbitrarily selected in the observed image, the average particle diameter of the particles was determined. With regard to the conductive particles, the average particle diameter of the particles having a conductive part was measured.

(3) Thickness of Conductive Part

With regard to the particles having a conductive part, by observing cross sections of arbitrary 50 particles, the thickness of the conductive part of the particles was determined.

(4) CV Value

By observing the particles with a scanning electron microscope, the standard deviation of the particle diameter of 50 particles arbitrarily selected in the observed image was determined, and by the above-described equation, the particle diameter CV value of the particles was obtained. With regard to the conductive particles, the particle diameter CV value of the particles having a conductive part was measured.

(5) Thermal Decomposition Temperature

Using a Thermogravimeter-Differential Thermal Analyzer "TG-DTA6300" manufactured by Hitachi High-Technologies Corporation, when 10 mg of particles was heated at 30° C. to 800° C. (temperature rising rate of 5° C./min) under the atmosphere, the temperature at which the weight of the particles decreased by 5% was defined as the thermal decomposition temperature.

(6) Aggregation State

The aggregation state of particles was evaluated by using an optical microscope (Nikon ECLIPSE "ME600" manufactured by Nikon Corporation). The aggregation state of particles was determined based on the following criteria

[Criteria for determining aggregation state of particles]

A: The number of aggregated particles per million particles is 100 or less

B: The number of aggregated particles per million particles exceeds 100

(7) Variation in Thickness

The end part of the obtained connection structure was observed with a SEM, and the minimum thickness and the maximum thickness of the bonded part were evaluated. The variation in thickness was determined based on the following criteria.

[Criteria for Determining Variation in Thickness]

○○: The maximum thickness is less than 1.2 times the minimum thickness

○: The maximum thickness is 1.2 times or more and less than 1.5 times the minimum thickness Δ: The maximum thickness is 1.5 times or more and less than 2 times the minimum thickness x: The maximum thickness is less than 2 times the minimum thickness (8) Connection Strength Using a resin paste for a semiconductor, a 4 mm×4 mm silicon chip and a back gold chip provided with a gold vapor-deposited layer on the bonded surface thereof were mounted on a solid copper frame and a PPF (Ni—Pd/Au plated copper frame), and cured at 200° C. for 60 minutes. After the curing and the moisture absorption treatment (at 85° C. and a relative humidity of 85% for 72 hours), the connection strength (shear strength) at 260° C. was measured using a mount strength measuring device.

[Criteria for Determining Connection Strength]

○○: Shear strength is 200 N/cm$^2$ or more

○: shear strength is 150 n/cm$^2$ or more and less than 200 N/cm$^2$

Δ: Shear strength is 100 N/cm$^2$ or more and less than 150 N/cm$^2$ x: Shear strength is less than 100 N/cm$^2$ (9) Thermal Cycle Characteristics (Connection Reliability)

The obtained connection structure was subjected to 1000 cycles of the thermal cycle test with setting a process of heating from −65° C. to 150° C. and cooling to −65° C. as one cycle. The presence or absence of the occurrence of cracking and peeling was observed with a Scanning Acoustic Tomograph (SAT). The thermal cycle characteristics were determined from the occurrence of cracking or peeling based on the following criteria.

[Criteria for Determining Thermal Cycle Characteristics]

○○: The number of the presence of cracking and peeling is zero out of 5 samples

○: The number of the presence of cracking and peeling is 1 to 2 out of 5 samples Δ: The number of the presence of cracking and peeling is 3 out of 5 samples x: The number of the presence of cracking and peeling is 4 to 5 out of 5 samples Composition and results are shown in Tables 1 to 3.

TABLE 1

| | | | Example 1 | Example 2 | Example 3 | Example 4 | Example 5 | Example 6 | Example 7 | Example 8 | Example 9 | Example 10 | Example 11 | Example 12 | Example 13 |
|---|---|---|---|---|---|---|---|---|---|---|---|---|---|---|---|
| Particles X | Particles or base material particles | Composition of particles or base material particles (% by weight) | 1,3-Divinyltetra-methyldisiloxane | 1.6 | 1.6 | 1.6 | 1.6 | 1.6 | 1.6 | 1.6 | 1.6 | 1.6 | | | | |
| | | | Dimethyl-dimethoxysilane | 49.2 | 40.3 | 32.8 | 16.4 | 16.4 | 32.8 | 32.8 | 32.8 | 32.8 | | | | |
| | | | Methylvinyl-dimethoxysilane | 49.2 | 49.2 | 49.2 | 49.2 | 65.6 | 49.2 | 49.2 | 49.2 | 49.2 | | | | |
| | | | Methylphenyl-dimethoxysilane | | 8.9 | 16.4 | 32.8 | | 16.4 | 16.4 | 16.4 | 16.4 | | | | |
| | | | Methyl-trimethoxysilane | | | | | 16.4 | | | | | | | | |
| | | | Isoprene | | | | | | | | | | 90 | | | |
| | | | Divinylbenzene | | | | | | | | | | 10 | 100 | 70 | 10 |
| | | | Polytetramethylene glycol diacrylate | | | | | | | | | | | | 30 | |
| | | | 1,4-Butanediol vinyl ether | | | | | | | | | | | | | |
| | | | Diisobutylene | | | | | | | | | | | | | |
| | | | Fluorene monomer | | | | | | | | | | | | | 90 |
| | | | Dicyclopentadiene | | | | | | | | | | | | | |
| | | | SPG pore diameter (μm) | 20 | 20 | 20 | 20 | 20 | 5 | 35 | 80 | 20 | 20 | 20 | 20 | 20 |
| | Conductive part | Material | | | | | | | | | | | | | | |
| | Evaluation | 10% K value (N/mm²) | | 80 | 305 | 809 | 1490 | 2862 | 798 | 779 | 745 | 802 | 1250 | 2432 | 1431 | 526 |
| | | Average particle diameter (μm) | | 30.5 | 31.1 | 31.5 | 32 | 30.4 | 11.3 | 53.2 | 101.1 | 30.8 | 31.2 | 33.5 | 32.8 | 31.1 |
| | | Thickness of conductive part (nm) | | | | | | | | | | | | | | |
| | | CV value (%) | | 2.5 | 2.8 | 2.2 | 2.1 | 2.6 | 2.7 | 2.5 | 2.4 | 8.2 | 2.3 | 2.5 | 2.5 | 2.2 |
| | | Thermal decomposition temperature (°C.) | | 320 | 335 | 341 | 347 | 352 | 356 | 355 | 355 | 342 | 262 | 287 | 248 | 250 |
| | | Aggregation state | | A | A | A | A | A | A | A | A | A | A | A | A | A |
| Connecting material | Composition excluding dispersant (% by weight) | Particles X | | 1 | 1 | 1 | 1 | 1 | 1 | 1 | 1 | 1 | 1 | 1 | 1 | 1 |
| | | Silver particles | | 99 | 99 | 99 | 99 | 99 | 99 | 99 | 99 | 99 | 99 | 99 | 99 | 99 |
| | | Silver oxide particles | | | | | | | | | | | | | | |
| | | Copper particles | | | | | | | | | | | | | | |
| | | Epoxy resin | | | | | | | | | | | | | | |
| Connection structure | Thickness of connection part (μm) | | | 26.8 | 27 | 27.2 | 27.7 | 27.3 | 8.2 | 49 | 98 | 28 | 27.2 | 27.8 | 27.9 | 28.1 |
| | Evaluation | Variation in thickness | | ○○ | ○○ | ○○ | ○○ | ○○ | ○○ | ○○ | ○○ | ○ | ○○ | ○○ | ○○ | ○○ |
| | | Connection strength | | ○○ | ○○ | ○○ | ○○ | ○ | ○○ | ○○ | ○○ | ○ | ○○ | ○ | ○○ | ○○ |
| | | Thermal cycle characteristics | | ○ | ○ | ○ | ○ | ○ | ○ | ○ | ○○ | ○ | ○ | ○ | ○ | ○ |

TABLE 2

| | | | Example 14 | Example 15 | Example 16 | Example 17 | Example 18 | Example 19 | Example 20 | Example 21 | Example 22 | Example 23 | Comparative Example 1 | Example 24 | Comparative Example 2 |
|---|---|---|---|---|---|---|---|---|---|---|---|---|---|---|---|
| Particles X | Particles or base material particles | Composition of particles or base material particles (% by weight) | 1,3-Divinyltetramethyldisiloxane | | 1.6 | 1.6 | 1.6 | 1.6 | 1.6 | 1.6 | 1.6 | | | 1.6 | 1.6 | 1.6 |
| | | | Dimethyldimethoxysilane | | 32.8 | 32.8 | 32.8 | 32.8 | 32.8 | 32.8 | 32.8 | | | 16.4 | 32.8 | 32.8 |
| | | | Methylvinyldimethoxysilane | | 49.2 | 49.2 | 49.2 | 49.2 | 49.2 | 49.2 | 49.2 | | | 24.6 | 49.2 | 49.2 |
| | | | Methylphenyldimethoxysilane | | 16.4 | 16.4 | 16.4 | 16.4 | 16.4 | 16.4 | 16.4 | | | 24.6 | 16.4 | 16.4 |
| | | | Methyltrimethoxysilane | | | | | | | | | | | 32.8 | | |
| | | | Isoprene | 30 | | | | | | | | | | | | |
| | | | Divinylbenzene | | | | | | | | | | | | | |
| | | | Polytetramethylene glycol diacrylate | | | | | | | | | | | | | |
| | | | 1,4-Butanediol vinyl ether | 70 | | | | | | | | | | | | |
| | | | Diisobutylene | | | | | | | | | 100 | | | | |
| | | | Fluorene monomer | | | | | | | | | | 100 | | | |
| | | | Dicyclopentadiene | | | | | | | | | | | | | |
| | | SPG pore diameter (μm) | | 20 | 20 | 20 | 20 | 20 | 20 | 20 | 20 | 20 | — | 20 | 350 | 20 |
| | | 10% K value (N/mm²) | | 467 | 809 | 809 | 809 | 809 | 609 | 800 | 800 | 350 | 1050 | 4120 | 722 | 800 |
| | | Average particle diameter (μm) | | 31 | 31.5 | 31.5 | 31.5 | 31.5 | 31.5 | 31.6 | 31.6 | 32.2 | 31.8 | 30.1 | 503.2 | 30.2 |
| | | CV value (%) | | 2.6 | 2.2 | 2.2 | 2.2 | 2.2 | 2.2 | 2.2 | 2.2 | 2.6 | 2.3 | 2.3 | 2.4 | 33.4 |
| | | Thermal decomposition temperature (°C) | | 260 | 341 | 341 | 341 | 341 | 341 | 341 | 341 | 354 | 262 | 370 | 360 | 347 |
| | | Aggregation state | | A | A | A | A | A | A | A | A | A | A | A | A | A |
| Conductive part | | Material | | 1 | 0.1 | 10 | | | | | Au | | | | | 1 |
| | | Thickness of conductive part (nm) | | 99 | 99.9 | 90 | | | | | 50 | | | | | 99 |
| Connecting material | Composition excluding dispersant (% by weight) | Particles X | | | | | | | | | | | | | | |
| | | Silver particles | | | | | 99 | | | | | | | | | |
| | | Silver oxide particles | | | | | | 99 | | | | | | | | |
| | | Copper particles | | | | | | | 99 | | | | | | | |
| | | Epoxy resin | | | | | | | | | | | | | | |
| Connection structure | Thickness of connection part (μm) | | | 28 | 27.2 | 27.2 | 27.2 | 27.2 | 27.2 | 27.5 | 27.6 | 27.6 | 27.8 | 29.6 | 496.2 | 29.9 |
| | Evaluation | Variation in thickness | | ○○ | ○○ | ○○ | ○○ | ○ | ○○ | ○○ | ○○ | ○○ | ○○ | ○○ | ○ | × |
| | | Connection strength | | ○○ | ○○ | ○○ | ○○ | ○○ | ○ | ○○ | ○○ | ○○ | ○○ | × | △ | × |
| | | Thermal cycle characteristics | | ○○ | ○○ | ○○ | ○○ | ○○ | ○ | | ○○ | ○○ | ○○ | × | △ | × |

TABLE 3

|  |  |  |  | Example 25 | Example 26 | Example 27 |
|---|---|---|---|---|---|---|
| Particles X | Particles or base material particles | Composition of particles or base material particles (% by weight) * | 1-3-Divinyltetramethyldisiloxane | 1.6 | 1.6 | 1.6 |
|  |  |  | Dimethyldimethoxysilane | 49.2 | 49.2 | 49.2 |
|  |  |  | Methylvinyldimethoxysilane | 49.2 | 49.2 | 49.2 |
|  |  |  | Methylphenyldimethoxysilane |  |  |  |
|  |  |  | Methyltrimethoxysilane |  |  |  |
|  |  | Composition excluding coated part | Isoprene |  |  |  |
|  |  |  | Divinylbenzene |  |  |  |
|  |  |  | Polytetramethylene glycol diacrylate |  |  |  |
|  |  |  | 1,4-Butanediol vinyl ether |  |  |  |
|  |  |  | Diisobutylene |  |  |  |
|  |  |  | Fluorene monaner |  |  |  |
|  |  |  | Dicyclopentadiene |  |  |  |
|  |  | SPG pore diameter (μm) |  | 20 | 20 | 20 |
|  | Conductive part | Material |  |  |  |  |
|  | Evaluation | 10% K value (N/mm$^2$) |  | 90 | 80 | 80 |
|  |  | Average particle diameter (μm) |  | 32 | 30.5 | 30.5 |
|  |  | Thickness of conductive part (nm) |  |  |  |  |
|  |  | CV value (%) |  | 2.5 | 2.5 | 2.5 |
|  |  | Thermal decomposition temperature (° C.) |  | 325 | 320 | 320 |
|  |  | Aggregation state |  | A | A | A |
| Connecting material | Composition excluding dispersant (% by weight) | Particles X |  | 1 | 1 | 1 |
|  |  | Silver particles |  | 99 | 99 | 99 |
|  |  | Silver oxide particles |  |  |  |  |
|  |  | Copper particles |  |  |  |  |
|  |  | Epoxy resin |  |  |  |  |
| Connection structure | Thickness of connection part (μm) |  |  | 27.1 | 26.8 | 26.8 |
|  | Evaluation | Variation in thickness |  | ○○ | ○○ | ○○ |
|  |  | Connection strength |  | ○○ | ○○ | ○○ |
|  |  | Thermal cycle characteristics |  | ○ | ○○ | ○○ |

EXPLANATION OF SYMBOLS

1: Particle
11: Particle (conductive particle)
12: Base material particle
13: Conductive part
21: Particle (conductive particle)
22: Conductive part
22A: First conductive part
22B: Second conductive part
51: Connection structure
52: First member to be connected
53: Second member to be connected
54: Connection part
61: Stress relaxation particles
62: Metal connection part

The invention claimed is:

1. A connecting material comprising:
  resin particles; and
  metal atom-containing particles,
  the resin particles having an average particle diameter of 1 μm or more and 300 μm or less,
  the resin particles having a 10% K value of 30 N/mm$^2$ or more and 3000 N/mm$^2$ or less,
  the resin particles having a particle diameter CV value of 10% or less, and
  the resin particles having a thermal decomposition temperature of 200° C. or more, and
  the metal atom-containing particles being metal atom-containing particles that are capable of being sintered by heating at less than 400° C.

2. The connecting material according to claim 1, wherein the number of aggregated particles per million particles of the resin particles is 100 or less.

3. The connecting material according to claim 1, wherein a material for the resin particles contains a vinyl compound, a (meth)acrylic compound, an α-olefin compound, a diene compound, or a silicone compound.

4. The connecting material according to claim 1, further comprising:
  a resin.

5. The connecting material according to claim 1, wherein the thermal decomposition temperature of the resin particles is higher than a melting point of the metal atom-containing particles.

6. A connection structure, comprising:
  a first member to be connected;
  a second member to be connected; and
  a connection part that connects the first member to be connected and the second member to be connected,
  a material for the connection part being the connecting material according to claim 1.

7. The connecting material according to claim 1, wherein the resin particles have the thermal decomposition temperature of 300° C. or more.

\* \* \* \* \*